United States Patent
Nehlsen et al.

(10) Patent No.: US 10,563,305 B2
(45) Date of Patent: Feb. 18, 2020

(54) CONTAINER FOR CHEMICAL PRECURSORS IN A DEPOSITION PROCESS

(71) Applicant: Air Products and Chemicals, Inc., Allentown, PA (US)

(72) Inventors: James Patrick Nehlsen, East Stroudsburg, PA (US); Charles Michael Birtcher, Valley Center, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 85 days.

(21) Appl. No.: 15/142,847

(22) Filed: Apr. 29, 2016

(65) Prior Publication Data

US 2016/0333477 A1 Nov. 17, 2016

Related U.S. Application Data

(60) Provisional application No. 62/160,933, filed on May 13, 2015.

(51) Int. Cl.
*C23C 16/455* (2006.01)
*C23C 16/52* (2006.01)
*C23C 16/448* (2006.01)

(52) U.S. Cl.
CPC .... *C23C 16/45563* (2013.01); *C23C 16/4481* (2013.01); *C23C 16/52* (2013.01)

(58) Field of Classification Search
CPC .......... C23C 16/45563; C23C 16/4481; C23C 16/45525; C23C 16/52
See application file for complete search history.

(56) References Cited

U.S. PATENT DOCUMENTS

| 5,589,110 A * | 12/1996 | Motoda ............... C23C 16/4481 257/E21.101 |
| 6,033,479 A | 3/2000 | Ikeda |
| 6,424,800 B1 * | 7/2002 | Kim .................... C23C 16/4481 118/724 |

(Continued)

FOREIGN PATENT DOCUMENTS

| JP | 2012160566 A2 | 8/2012 |
| JP | 5589873 | 9/2014 |
| WO | 2010025068 A2 | 3/2010 |

OTHER PUBLICATIONS

Air Liquide, "ALOHA Special Precursors: ZyALD", 2007.

*Primary Examiner* — Kelly M Gambetta
(74) *Attorney, Agent, or Firm* — Lina Yang

(57) ABSTRACT

Described herein are systems and methods using same for the storage and delivery of chemical precursors that are used in the manufacture of a semiconductor device. In one aspect, the storage system comprises the chemical precursors and a container and the systems have an inlet jet design. The chemical precursor has a low vapor pressure less than about 50 Torr-absolute at container temperature set for delivery. The delivery system further contains a carrier gas. The inlet jet design can deliver the carrier gas at a certain pressure and a certain low rate to impinge upon the surface of the chemical precursors to produce a vapor or droplets of the chemical precursor. The vapor or droplets of the chemical precursor then combine with the carrier gas to provide a precursor-laden fluid stream which will be passed to and used in the processing tool.

20 Claims, 1 Drawing Sheet

(56) References Cited

U.S. PATENT DOCUMENTS

| | | |
|---|---|---|
| 7,156,380 B2 | 1/2007 | Soininen |
| 8,162,296 B2 | 4/2012 | Birtcher et al. |
| 8,313,804 B2 | 11/2012 | Carlson et al. |
| 2005/0249873 A1 | 11/2005 | Sarigiannis et al. |
| 2008/0216743 A1* | 9/2008 | Chen ........................ C23C 16/18 118/719 |
| 2009/0053426 A1 | 2/2009 | Lu et al. |
| 2013/0205611 A1* | 8/2013 | Wamura ................. F26B 19/00 34/60 |

* cited by examiner

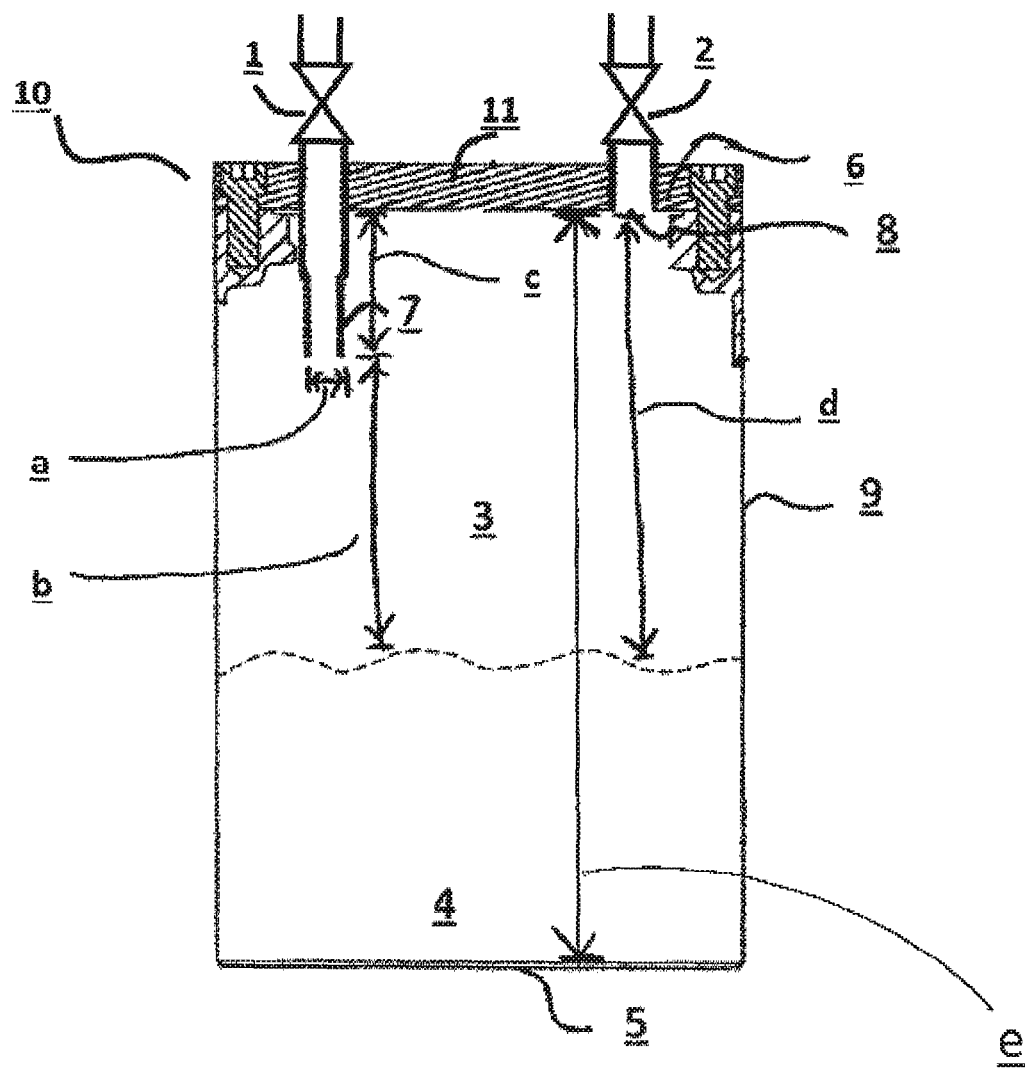

CONTAINER FOR CHEMICAL PRECURSORS IN A DEPOSITION PROCESS

CROSS REFERENCE TO RELATED PATENT APPLICATIONS

The present patent application claims the benefit of U.S. Provisional Patent Application Ser. No. 62/160,933 filed May 13, 2015.

BACKGROUND OF THE INVENTION

Described herein is a system and method using same for storing and delivering a process chemical or chemical precursor, such as a high purity, liquid chemical precursor, to a process tool that is used in the manufacture of a semiconductor device. More specifically, described herein is a system comprising a container (a vessel or an ampoule), and chemical precursors for a process tool such as a deposition reactor in a chemical vapor deposition (CVD) or atomic layer deposition (ALD) process.

Semiconductor manufacturing processes involve the use of high purity, chemical reagent(s) or liquid chemical precursors that are delivered to a reactor and used to deposit a material on a substrate. These chemical precursors are typically contained in sealed containers to protect against contamination of the precursors and to prevent leakage. Precursors used in CVD or ALD processes are routinely delivered to the reactor by evaporating them into a carrier gas that is passed through a container of the chemical. Some of these precursors which are used in the manufacture of semiconductors exhibit low vapor pressure (less than about 50 Torr-absolute at delivery temperature).

The Containers for delivering those liquid precursors typically inject the incoming carrier gas below the surface of the liquid, creating a so-called 'bubbler' design, as disclosed in U.S. Pat. No. 8,313,804 B2 and U.S. Pat. No. 6,033,479 A. Injection of the gas below the surface causes the gas to form bubbles that rise through the liquid before bursting on the surface, releasing the gas to travel as a vapor to the outlet of the container. Bubbling the gas through the liquid is an effective means of creating greater gas-liquid contact time and area, which aids in achieving a gas stream that is saturated with the evaporated liquid precursor. Achieving a saturated carrier gas maximizes the delivery rate of the precursor and is generally beneficial to the operation of the deposition process. The use of a bubbler design is most beneficial for low vapor pressure precursors, such as those with vapor pressure less than about 50 Torr-absolute, which require the use of a carrier gas.

However, some liquid precursors may either contain solid particulates or form solid particulates over time through a chemical change (decomposition). For such materials, the bursting of bubbles at the surface of the liquid in a bubbler-style container can lead to the formation of aerosols and/or mists. These aerosols or mists can become entrained in the carrier gas flow and transport solids or dissolved solids to the outlet of the container. At the outlet of the container, such solids or dissolved solids may accumulate in the outlet valves or other locations downstream of the container. Deposition of these solid materials can cause plugging, flow restrictions, and other undesirable phenomena.

Thus, such a bubbler container design is unsuitable for materials that may contain or form solid particulates, since such particulates could become lodged in the outlet valve or any downstream process section.

U.S. Pat. No. 5,589,110 ("the '110 Patent") describes metal organic compound container apparatus for containing a liquid metal organic compound, receiving a carrier gas, and producing a carrier gas stream saturated with vapor of the metal organic compound including a container for containing a liquid metal organic compound; an inlet pipe for introducing a carrier gas into the container, the inlet pipe having an end for immersion in the metal organic compound; a carrier gas flow rate controller for controlling carrier gas flow into the inlet pipe; a first exhaust pipe for exhausting carrier gas from the container at a first flow rate, the first exhaust pipe having an end not contacting the metal organic compound; a first gas flow rate controller for controlling one of pressure and the first flow rate of the carrier gas through the first exhaust pipe; a second exhaust pipe for exhausting carrier gas from the container at a second flow rate, the second exhaust pipe having an end not contacting the metal organic compound; and a second gas flow rate controller for controlling the second flow rate. In one embodiment of the '110 Patent, the container comprises adjusting pipes that "slidably provided at respective ends of said inlet pipe and said exhaust pipe for position of the inlet and the exhaust pipe above and spaced from a surface of a metal organic compound in said container" and "including a float attached to said adjusting pipes for floating in a metal organic compound in said container, thereby maintaining said adjusting pipes spaced from the metal organic compound in said container."

The inlet pipes and floats can be moving during use to compensate for the reduced mass transfer that occurs as the distance between the inlet pipe and liquid surface increases. This problem is particularly acute with the low carrier gas flow rates specifically addressed in the '110 patent.

However, moving inlet pipes and floats can cause some complications, particularly if the liquid precursor contains solids or dissolved solids. The inlet pipes and floats can become stuck during use by deposition of the solids in the sliding mechanism, and are difficult to clean after use.

There is a need in the art for a system and a method to contain and deliver liquid process chemical(s) or chemical precursors that may contain or form solid particulates that reduces one or more of the following problems: plugging, flow restriction, insufficient saturation of precursor in the carrier gas, drop off in saturation, ease of manufacture, and/or ability to be thoroughly cleaned after use.

SUMMARY OF THE INVENTION

Described herein are systems and methods that eliminate one or more of the problems in the art by avoiding the formation of aerosols and mists in liquids that contain solids or can form solids under conditions found in the container.

In one aspect, the invention is a system for storage and delivery of a chemical precursor to a process tool, comprising the chemical precursor selected from the group consisting of metal β-diketonates, metal β-diketoesterates, metal β-ketoiminates, metal β-diiminates, metal alkyls, metal carbonyls, alkyl metal carbonyls, metal cyclopentadienyls, metal cyclopentadienyls carbonyls, metal pyrrolyls, metal imidazolyls, metal amidinates, metal alkoxides, and combinations thereof;

wherein ligand is selected from the group consisting of monodentate, bidentate and multidentate complexing to the metal atoms, and the metal is selected from the group consisting of Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo and W;

a container containing the chemical precursor; comprises
  a sidewall;
  a base;
  a lid; and
  a head space including space above the chemical precursor within the container; and
  an inlet passing through the lid and having a nozzle inside the head space;
    wherein tip of the nozzle is located with a distance of greater or equal to 0.5 inches from surface of the chemical precursor and the nozzle is at a 90° angle to the chemical precursor surface; and
  an outlet passing through the lid;
wherein the chemical precursor within the container has a low vapor pressure less than about 50 Torr-absolute at container temperature set for delivery, preferably less than about 10 Torr-absolute at container temperature set for delivery, and has a melting point above or below the container temperature set for storage and below the container temperature set for delivery.

In another aspect, the invention is a system for the delivery of a liquid chemical precursor to a process tool, comprising:

the chemical precursor selected from the group consisting of metal β-diketonates, metal β-diketoesterate, metal β-ketoiminates, metal β-diiminates, metal alkyls, metal carbonyl, alkyl metal carbonyl, metal cyclopentadienyls, metal cyclopentadienyls carbonyls, metal pyrrolyls, metal imidazolyls, metal amidinates, metal alkoxides, and combinations thereof; wherein ligand is selected from the group consisting of monodentate, bidentate and multidentate complexing to the metal atoms, and the metal is selected from the group consisting of Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo and W;

a container containing the chemical precursor; comprises
  a sidewall;
  a base;
  a lid; and
  a head space including all space above the chemical precursor within the container; and
  an inlet passing through the lid and having a nozzle inside the head space;
    wherein tip of the nozzle is located with a distance of greater or equal 0.5 inches from surface of the chemical precursor and the nozzle is at a 90° angle to the chemical precursor surface; and
  an outlet passing through the lid;
a carrier gas passing through the nozzle and impinging upon surface of the chemical precursor to produce a vapor or droplets of the chemical precursor which combines with the carrier gas to form a precursor-laden fluid stream; and
the precursor-laden fluid stream passing through the outlet to the process tool;
  wherein the liquid chemical precursor has a vapor pressure less than 50 Torr-absolute at container temperature set for delivery, preferably less than about 10 Torr-absolute at container temperature set for delivery.

In yet another aspect, the invention is a method for storage and delivery of a liquid chemical precursor to a process tool, comprising:

providing the liquid chemical precursor selected from the group consisting of metal β-diketonates, metal β-diketoesterates, metal β-ketoiminates, metal β-diiminates, metal alkyls, metal carbonyls, alkyl metal carbonyls, metal cyclopentadienyls, metal cyclopentadienyls carbonyls, metal pyrrolyls, metal imidazolyls, metal amidinates, metal alkoxides, and combinations thereof;
  wherein ligand is selected from the group consisting of monodentate, bidentate and multidentate complexing to the metal atoms, and the metal is selected from the group consisting of Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo and W;

providing a container containing the chemical precursor, comprises
  a sidewall;
  a base;
  a lid; and
  a head space including all space above the liquid chemical precursor within the container;
  an inlet passing through the lid and having a nozzle inside the head space; and
  an outlet passing through the lid;
    wherein tip of the nozzle is located with a distance of greater or equal 0.5 inches from surface of the liquid chemical precursor; the nozzle is at a 90° angle to the chemical precursor surface;
passing a carrier gas through the nozzle and impinging upon surface of the liquid chemical precursor to produce a vapor or droplets of the chemical precursor which combines with the carrier gas to form a precursor-laden fluid stream; and passing the precursor-laden fluid stream through the outlet out from the container to the process tool;
wherein the liquid chemical precursor within the container has a low vapor pressure less than about 50 Torr-absolute at container temperature set for delivery, preferably less than about 10 Torr-absolute at container temperature set for delivery.

The chemical precursor preferably is a metal carbonyl selected from the group consisting of dicobalt hexacarbonyl tert-butylacetylene (CCTBA), dicobalt hexacarbonyl dialkylacetylene, cyclopentadienylcobalt dicarbonyl, alkylcyclopentadienyl cobalt dicarbonyl, cyclopentadienylmanganese tricarbonyl ($CpMn(CO)_3$), alkylcyclopentadienylmanganese tricarbonyl (e.g. $MeCpMn(CO)_3$, $EtCpMn(CO)_3$), cyclopentadienyltungsten tricarbonyl hydride ($CpW(CO)_3H$)), alkylcyclopentadienyl tricarbonyl hydride ($(RCp)W(CO)_3H$), tris(carbonyl)(alkylcyclopentadienyl)methyl tungsten ($(RCp)W(CO)_3Me$), tris(carbonyl)(alkylcyclopentadienyl) ethyl tungsten ($(RCp)W(CO)_3Et$), and combinations thereof.

The nozzle has an equivalent diameter ranges from about 1/16 inch to about 1/2 inch, preferably from about 1/16 inch to about 1/4 inch.

The container further comprises a rate controller or a valve connected to the inlet for controlling flow rate of the carrier gas ranging from about 100 to about 3000 standard cubic centimeters (sccm), preferably 300 to about 1500 sccm, and more preferably 500 to about 1000 sccm.

The carrier gas at the tip of the nozzle has a Reynolds number of greater than 50, preferably 150, more preferably 200, and most preferably 300.

The liquid chemical precursor can contains or forms >0.01 wt % and <20 wt %, preferably >0.1 wt % and <10 wt % solid or non-volatile dissolved components or impurities, where the solid or non-volatile dissolved components or impurities are not passed through the container outlet.

BRIEF DESCRIPTION OF THE DRAWINGS

The present invention will hereinafter be described in conjunction with the appended drawing FIGURES wherein like numerals denote like elements.

FIG. 1 provides an embodiment of the system described herein.

DETAILED DESCRIPTION OF THE PREFERRED EMBODIMENTS

Described herein are systems and methods that are used to store and provide chemical precursors (i.e., process chemicals) to a process tool designed for manufacturing semiconductors. Furthermore, the process chemical can be easily and efficiently cleaned from associated components in the systems.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In order to aid in describing the invention, some terms are defined and used in the specification.

The term "conduit", may be used in the specification and claims, refers to one or more structures through which fluids can be transported between two or more components of a system. For example, conduits can include pipes, ducts, passageways, and combinations thereof that transport liquids, vapors, and/or gases.

The term "flow communication," as used in the specification and claims, refers to the nature of connectivity between two or more components that enables liquids, vapors, and/or gases to be transported between the components in a controlled fashion (i.e., without leakage). Coupling two or more components such that they are in flow communication with each other can involve any suitable method known in the art, such as with the use of welds, flanged conduits, gaskets, and bolts.

The term "electric communication", as used in the specification and claims, refers to the use of electronics to operate the system or method described herein and can be constructed within in one or more of the bulk chemical cabinet and/or solvent supply cabinet system, or may be placed in a separate enclosure and connected to the main system components through cables and tubing as required for a specific setup. In one particular embodiment, the electronics enclosure is placed on top of the cabinet and connected through feedthroughs into the main cabinet or alternatively located in a chemically isolated region of the main cabinet. In certain embodiments, the electronics control system such as the source control module (SCM) or source controller electronic (SCE) generally consists of a micro-controller, a microprocessor, a PLC (programmable Logic Controller) or another type of computer that conducts the functions of sequencing the system, monitoring alarms, communicating to various vessels such as without limitation, spent solvent vessels, solvent recovery vessels, bulk process chemical vessel, chemical recovery vessel, bulk solvent vessel, and the main processing tool. This communication can take place using "Direct digital control" that generally takes the form of a series of input and output relays, optically isolated to prevent stray interference from causing problems or a variety of other means. This communication may also take place using a serial interface such as an RS-232 link, IEEE 485, Modbus, DeviceNet, or using a computer network interface, such as Ethernet, or wireless protocols and is not limited thereto.

The term "Reynolds number" is a dimensionless quantity used in fluid mechanics known in the art. The Reynolds number is defined as the mathematical product of the velocity of the fluid, the equivalent diameter of the pipe that the fluid is passing, and the density of the fluid, divided by the dynamic viscosity of the fluid. For flow in a cylindrical pipe, the internal diameter is generally used as the equivalent diameter. Other shapes such as rectangular pipes or non-cylindrical pipes the equivalent diameter is defined as $D_E=4A/P$, where A is the cross sectional area and P is the perimeter of the cross-section.

Some directional terms may be used in the specification and claims to describe portions of the present invention (e.g., upper, lower, left, right, etc.). These directional terms are merely intended to assist in describing and claiming the invention, and are not intended to limit the invention in any way. In addition, reference numerals that are introduced in the specification in association with a drawing FIGURE may be repeated in one or more subsequent FIGURES without additional description in the specification in order to provide context for other features.

Alternative names for the containers described herein include "Vessels", "Ampoules", "Source Containers", "Hosts" and other proprietary names.

The system comprises the chemical precursor; a container having the chemical precursor contained therein; and a carrier gas being introduced into the container. The chemical precursor within the container has a low vapor pressure less than about 50 Torr-absolute and a melting point above or below the container temperature set for storage system and below container temperature set for delivery system.

In certain embodiments, the containers that are used to deliver the chemical precursor to the process tool (such as deposition chambers) range in volume from 100 milliliters (ml) to 10 liters.

The container comprises a sidewall; a base; a lid; a head space or a vapor space that is defined as the space above the surface of the liquid chemical precursor inside the container. The container further comprises an inlet and an outlet both passing the lid. The inlet has a nozzle for introducing the carrier gas into the head space at a certain pressure and flow rate. The carrier gas out from the nozzle impinges upon the surface of the liquid chemical precursor to provide a precursor-laden fluid stream. The precursor-laden fluid stream exits the container through the outlet and passes to the process tool such as the deposition chamber for use.

In one aspect, to avoid the formation of aerosols and mists in liquids that contain solids or can form solids under conditions found in the container, the delivery system can achieve carrier gas saturation without using a bubbler. Rather than injecting the carrier gas below the surface of the liquid chemical precursor, the carrier gas is instead injected as a jet in the vapor or head space above the liquid chemical precursor. The delivery systems have an inlet design or an inlet jet design that can inject the carrier gas as a jet.

In one particular embodiment, the jet of carrier gas is directed vertically downward at a 90° angle or perpendicular to the surface of the liquid chemical precursor. The jet of carrier gas impinges on the surface of the liquid chemical precursor, thereby reducing the mass transport limitations that occur in other designs, such as bubbler designs, where the carrier gas is not directed onto the surface of the liquid chemical precursor. The jet of carrier gas is designed such that it has sufficient momentum to perturb the surface of the liquid chemical precursor regardless of the liquid level in the container, but insufficient momentum to generate significant splashing at the site of impingement.

In this and/or other embodiments, the tip i.e., the exit point of the nozzle is located in the head space and is at a minimum distance from the surface of the liquid chemical precursor. The minimum distance is determined by the factors such as not to generate significant splashing at the site of impingement. For an example, the minimum distance is 0.5 inches for the containers used in the present invention.

The equivalent diameter of the nozzle ranges from about 1/16 inch to about 1/2 inch. The carrier gas flow in through the inlet at flow rates ranges from about 100 to about 3000 standard cubic centimeters (sccm), preferably from about 300 to about 1500 sccm, and more preferably from about 500 to about 1000 sccm. Typically, lower carrier gas flow rates require smaller equivalent diameter nozzles to achieve a sufficient velocity to impinge on the liquid surface.

To impinge on the surface of the liquid, the nozzle is preferably designed to achieve a Reynolds number greater than 50, preferably greater than 150, more preferably greater than 200, and most preferably greater than 300 for the carrier gas. The Reynolds number used here is the mathematical product of the nozzle equivalent diameter, such as the inner diameter for a cylindrical nozzle; the actual gas velocity in the nozzle tip, and density of the carrier gas, divided by the dynamic viscosity of the carrier gas. When determining these physical properties, the temperature and pressure inside the container head space are used as the basis.

In certain embodiments, the containers have a large cap, lid, or bung that is fastened such as by screws or other means onto the top of the reservoir and sealed with elastomeric or metal o-rings and/or gaskets. This lid frequently has a flat surface that is used for the installation of level sense probes, including float, ultrasonic, differential pressure, thermal and other styles of immersible level senses. They typically are mounted in process tools or OEM tools for use in delivering small amounts of chemical precursor to the process tool. In a direct liquid injection (DLI) process, the exact flow rate may be limited by pressure, therefore requiring that inlet pressures be tightly controlled. Often these containers are kept in small temperature controlling units to maintain variables like vapor pressure, viscosity and precursor reactivity.

The material for the construction of the containers is typically stainless steel, but may be made from other materials as well, depending on the reactivity of the chemical precursor with the material in question. The materials of construction of the system described herein exhibit one or more of the following characteristics: chemically compatible to prevent corrosion or reaction with the chemical precursor, strong enough to support the pressures and vacuum forces used, and generally leak tight to hold vacuum from 1 mTorr to 500 mTorr depending on the process chemicals and/or solvent in use.

Exemplary materials of construction may include, but are not restricted to: metals such as electropolished or non-electropolished stainless steel, copper, Hasteloy, Elgiloy, nickel, polysilion, titanium and other metals or alloys compatible with process chemical and solvent; plastics such as polytetrafluoroethylene (PTFE) or PFA or other formulations of Teflon, polyethylene, polypropylene, HDPE, and other materials compatible with semiconductor precursors or solvents; sealing materials, such as Vespel brand, Kynar brand, Kalrez brand, Chemraz brand and Viton brand sealants; polymers and elastomers; ceramic materials or glasses, such as fused quartz, borosilicate glass, pure glass, boron nitride, silicon carbide, and related ceramic or glass materials; and/or lined or composite materials, such as carbon fiber or Teflon lined components, carbon fiber/resin materials; and other similar materials that are compatible with high purity process chemicals and solvents.

The containers also contain one or a plurality of valves and ports and sensors, to allow access to the chemical precursor.

The containers may further include a means for initially filling and cleaning the reservoir, i.e., the inner space.

In certain embodiments, one or more of the container(s) contain a level sense system, which may be disposed within or outside the container. In embodiments, wherein the level sense system is disposed within the container, the level sensing function is performed using ultrasonic level sensors or, alternatively, float probes. Other level sense techniques include, but are not limited to, thermally based level sense, differential pressure, both discrete and continuous ultrasonic level sense, capacitive, optical and microwave impulse radar level senses, and/or combinations thereof. The level sense may also be disposed outside of the reservoir. These level sense types include ultrasonic, scales/load cells, thermal, X-ray/radiation, and similar techniques. These techniques have the advantage of having no penetration into the reservoir interior, even though the accuracy of the measurement may not be quite as accurate. Ultrasonic empty sensing can be done using an ultrasonic sensor attached, clamped-on, or embedded to the liquid delivery line, permitting the refill system to precisely gauge when no more chemical is left in the replaceable bulk tank, allowing the end-user customer to consume the majority of process chemical.

Each container also contains a means for moving the chemical precursor out of its interior volume. This may be comprised of a dip tube, usually made of an inert material such as stainless steel, but also other metals such as copper for copper precursors, titanium, nickel, Elgiloy, Hasteloy and other similar materials, non-metallic materials such as silicon carbide, boron nitride, glass, fused quartz, and so on. In certain embodiments, a fixed dip tube is welded onto the interior surface of the reservoir, or to an extension piece penetrating the reservoir wall and in both cases, extending to a tube that is connected to an outlet valve. This outlet valve then controls the flow of the precursor chemical to the rest of the system, and may be manual or automatic in operation.

In one particular embodiment, a removable dip tube is used. In this embodiment, the removable dip tube, which mounts to the reservoir though a connection such as a VCR or UPG fitting to seal it against leaks and to permit its easy removal for cleaning and repair. Typically, a removable dip tube will be inserted through a sleeve that is welded to the outside of the container, with the fitting also mounted on the sleeve. In this or other embodiments, the dip tube contains the appropriate fitting to mate to the sleeve.

In either embodiment of dip tube, dip tube ends at a point below the lowest level sense point to prevent waste of valuable process chemical. In most container designs, the bottom of the container is shaped to facilitate the flow of chemical to the lowest point in the container, either through the installation of a well, the use of a hemi-spherical base, or an assymetric bottom arrangement, mostly dependent upon the designed location of the dip tube.

The container(s) can further contain a separate penetration for inert gas to flow into the container. In certain embodiments, the chemical flows, at least initially, due to differential pressure between the inlet side of the container and the pressure at the outlet of the container. After that, pumps or other means may occasionally be used to deliver the chemical to where it is needed. This penetration usually takes the form of a small tube welded to the top of the container, which is then attached to a valve (either manual or automatic) that controls the influx of the inert gas into the container. The flow direction of the inert gas line penetration is not defined, and can be used for multiple functions, for example, venting of excess pressure from the interior of the vessel, or refilling from a separate container (by itself for further incorporating a third port for that function). The inert gas line may be attached to a baffle in the interior of the container, which is used to prevent the splattering of process chemical into the inert gas delivery system or into the vent system during a venting operation. Such a baffle can consist of right angled tubing, a "tee" fitting, a screen/mesh assembly, or a filter, including metal, ceramic or plastic filters all available on the open market. Typically, the space above the liquid level is called the head space, so this port is usually called a head space port.

Note that for different applications, the relative location of the dip tube and head space ports may alternate. In the event of a direct liquid injection (DLI) process, or for transferring liquid chemical from one container to another, the inert gas is fed into the head space of the container and the liquid removed via the dip tube. However, for applications that use diluted chemical vapors and not pure liquid chemical, the dip tube may be attached to the inert gas source, allowing the inert gas to bubble through the liquid, saturating it with vapors of them chemical, which is then directed out of the reservoir and into a process chamber. Frequently, these types of process require heating of the container to control the vapor pressure and consequent pickup of the process chemical. In certain embodiments, the system or method described herein uses temperature control or system incorporating same on the piping upstream, downstream, or both of the container to maintain the vapors or liquid in the proper state and prevent condensation or solidification, respectively.

In one embodiment, the container comprises a level sensor and a head space valve. In these embodiments, the container head space is exposed to a vacuum and the process chemical evaporates into the head space and is then directed to the process tool such as the deposition chamber for use.

In another embodiment, a magnetic device in the container that is located on a tube/rod in the container which has small jets welded to it. These could be coupled to the inlet using a tubing which is flexible and inert to most chemicals. A liquid level sensor can be used to obtain the level information and then a small controller can be used to adjust the strength applied to an external magnet used in opposing fashion so the puck inside the container is controlled at a specific height relative to the level signal.

Yet, in another embodiment, a rod is inserted through the lid using o-rings as the barrier to atmosphere and the rod has small jets welded to its tip. A liquid level sense can be used to obtain the level information and then a motor can be employed to adjust the height of the jets based on the level feedback.

In another embodiment the support for the nozzle could be spring loaded and a pressurized cylinder could be used to move the nozzle support up and down relative to the liquid level reported by the level probe.

One aspect of the system, and method described herein is to provide constant and stable outlet pressure and a constant flow of process chemical without downtime or interruption in supply.

FIG. 1 provides an example of one embodiment of the system 10 described herein.

Description of the parts of the system shown in FIG. 1 is provided below.

1. Carrier gas inlet
2. Outlet
3. Head space or Vapor space (size varies with fill level)
4. Chemical precursor to be delivered
5. Container base
6. Vapor outlet
7. Carrier gas inlet nozzle
8. Inlet of vapor outlet
9. Container sidewall
10. The system
11. Lid As FIG. 1 shows, the system 10 comprises a container and liquid chemical precursor 4 to be delivered. The container comprises an interior volume defined by the container base 5, container sidewall 9, and lid 11 to house the liquid chemical precursor 4. The surface of the liquid chemical precursor 4, sidewall 9 and interior surface of the lid 11 define the head space or vapor space 3. The head space is the space above the surface of the chemical precursor 4 inside the container. The size of 3 varies with the fill level of liquid precursor 4.

The container of the system 10 has a carrier gas inlet 1 which is in fluid communication with the interior volume, head space 3 and a control valve outside of the container. The carrier gas inlet 1 passes the lid and has a nozzle 7 inside the head space.

In operation of the delivery, the system 10 has a carrier gas such as, without limitation, an inert gas including but not limited to helium, neon, argon, krypton, xenon, nitrogen, and combination thereof, is introduced through carrier gas inlet valve 1 through carrier gas inlet nozzle 7.

The shape of nozzle 7 can be converging, diverging, straight tube or other geometries. The cross section of nozzle 7 can be a circle or any other shape. In certain embodiments (not shown in FIG. 1), nozzle 7 may have a conical shaped tip.

Referring again to FIG. 1, nozzle 7 has an equivalent diameter designated as "a" in FIG. 1. The equivalent diameter of nozzle 7 ranges from about 1/16 inch to about 1/2 inch. The distance between the tip of the nozzle 7 and the surface of the liquid chemical precursor 4 is designated as "b". The distance between the tip of nozzle and the lid is designated as "c" in FIG. 1.

In FIG. 1, nozzle 7 is directed at an angle which is perpendicular or at a 90° angle to the surface of liquid precursor 4 and/or to the lid. However, other angles may be used in other embodiments of the system described herein. With regard to the latter, other angles can be used provided that the jet of carrier gas is above the liquid precursor surface and to impact at least a portion of the liquid precursor surface.

As mentioned above, the carrier gas is directed through nozzle 7 into head space 3 and impacts the surface of liquid precursor 4 at a certain velocity or flow rate. The carrier gas flow rates ranges from about 100 to about 3000 standard cubic centimeters (sccm), preferably from about 300 to about 1500 sccm, more preferably from 500 to 1000 (sccm).

The carrier gas impacts the surface of liquid precursor 4 and produces a vapor or droplets of precursor which combine with the carrier gas to provide a precursor-laden stream.

The container of the system 10 also has a vapor outlet valve 2 which is in fluid communication with the interior volume and head space 3 of container of the system 10. The vapor outlet valve 2 has an inlet 8 of vapor outlet for removing the precursor-laden fluid stream from the container to the process tool.

The distance between the inlet 8 of vapor outlet and the surface of the liquid precursor is designated as "d" in FIG. 1.

In certain embodiments, one or more of the elements in the system described herein are in electrical communication with a processing device to receive or transmit information related to a variety of parameters, such as, without limitation, temperature, pressure, liquid level, and/or flow rate of the carrier gas.

As previously mentioned, the systems and methods described herein are used to store and/or deliver a chemical precursor to a reactor. In the scope of this invention the chemical precursor has a melting point below the precursor delivery temperature or below container temperature used for precursor delivery to the semiconductor device. Thus, the precursor may be a solid at a storage temperature which is below the delivery temperature, but it is delivered from a molten phase, i.e. as a liquid precursor.

The precursor can be selected from at least one metal complex selected from the group consisting of metal β-diketonates, metal β-diketoesterate, metal β-ketoiminates, metal β-diiminates, metal alkyls, metal carbonyl, alkyl metal carbonyl, metal cyclopentadienyls, metal cyclopentadienyls carbonyls, metal pyrrolyls, metal imidazolyls, metal amidinates, and metal alkoxides, wherein the ligand can be monodentate, bidentate and multidentate, complexing to the metal atoms, and the metal is selected from Group 2 to 15 elements of the Periodic Table of the Elements including but not limited to Mg, Ca, Sr, Ba, Y, La, Ce, Sm, Tb, Er, Yb, Lu, Ti, Zr, Hf, Fe, Co, Ni, Ru, Ir, Rh, Cu, Al, Sn, Pb, Sb, Bi, Te, Cr, Mo and W. Exemplary process chemicals that can be used with the system and method described herein include, but are not limited to, dicobalt hexacarbonyl tert-butylacetylene (CCTBA), dicobalt hexacarbonyl dialkylacetylene ((R'CCR") $Co_2(CO)_6$), cyclopentadienylcobalt dicarbonyl, alkylcyclopentadienyl cobalt dicarbonyl, cobalt tricarbonyl nitrosyl ($Co(CO)_3(NO)$), (tert-butylallyl)cobalt tricarbonyl ($^tBuAllyl)Co(CO)_3$, cyclopentadienylmanganese tricarbonyl ($CpMn(CO)_3$), alkylcyclopentadienylmanganese tricarbonyl (e.g. $MeCpMn(CO)_3$, $EtCpMn(CO)_3$), 3-(t-BuAllyl)$Mn(CO)_4$, cyclopentadienyltungsten tricarbonyl hydride ($CpW(CO)_3H$)), alkylcyclopentadienyl tricarbonyl hydride ($(RCp)W(CO)_3H$), tris(carbonyl)(alkylcyclopentadienyl)methyl tungsten ($(RCp)W(CO)_3Me$), tris(carbonyl)(alkylcyclopentadienyl)ethyl tungsten ($(RCp)W(CO)_3Et$), alkylcyclopentadienylbis(nitrosyl)hydridotungsten ($(RCp)W(NO)_2)H$), alkylcyclopentadienylbis(nitrosyl)methyltungsten ($(RCp)W(NO_2)Me$), alkylcyclopentadienyl-bis(nitrosyl)ethyltungsten ($(RCp)W(NO_2)Et$), bis(isopropylcyclopentadienyl) tungsten dihydride ($^iPrCp)_2WH_2$, bis(alkylcyclopentadienyl) tungsten dihydride $(RCp)WH_2$, Ni(II)N,N'-di-tertiary-butylamidinate (Ni(II)($^tBu$-AMD)$_2$), Ni(II)N,N'-di-isopropylamidinate(Ni(II)($^iPr$-AMD)$_2$), Ni(II)N,N'-di-ethylamidinate(Ni(II)(Et-AMD)$_2$), Ni(II)N,N'-di-methylamidinate(Ni(II)(Me-AMD)$_2$), Co(II)N,N'-di-tertiary-butylamidinate(Co(II)(tBu-AMD)$_2$), Co(II)N,N'-di-isopropylamidinate(Co(II)($^iPr$-AMD)$_2$), Co(II)N,N'-di-ethylamidinate(Co(II)(Et-AMD)$_2$), Co(II)N,N'-di-methylamidinate(Co(II)(Me-AMD)$_2$), titanium tetrachloride ($TiCl_4$), tetrakis(dimethylamido)titanium (TDMAT), tetrakis(diethylamido)titanium (TDEAT), tetrakis(ethylmethylamido)titanium (TEMAT), bis(ethylcyclopentadienyl)ruthenium(($EtCp)_2Ru$), bis(dimethylpentadienyl)ruthenium, bis(diethylpentadienyl)ruthenium, tetrakis(dimethylamido)hafnium (TDMAH), tetrakis(diethylamido)hafnium (TDEAH), tetrakis(ethylmethylamido)hafnium (TEMAH), tetrakis(dimethylamido)zirconuim (TDMAZ), tetrakis(diethylamido)zirconium (TDEAZ), tetrakis(ethylmethylamido)zirconium (TEMAZ), cyclopentadienyl-tris(dimethylamino)hafnium, methylcyclopentadienyl-tris(dimethylamino)hafnium, ethylcyclopentadienyl-tris(dimethylamino)hafnium, cyclopentadienyl-tris(dimethylamino)zirconium, methylcyclopentadienyl-tris(dimethylamino)zirconium, ethylcyclopentadienyl-tris(dimethylamino)zirconium, tert-butylimido-tris(dimethylamino)tantalum (TBTDMAT), tert-butylimino-tris(diethylamino)tantalum (TBTDET), tert-butylimido-tris(methylethylamino)tantalum (TBTEMT), tert-amylimido-tris(dimethylamino)tantalum (TAIMAT), ethylimino tri(diethylamino)tantalum (EITDET), ethylimino tri(dimethylamino)tantalum (EITDMT), ethylimino tri(ethylmethylamino)tantalum (EITEMT), bis(tert-butylimino)bis(dimethylamino)tungsten (BTBMW), bis(tert-butylimino)bis(diethylamino)tungsten, bis(tert-butylimino)bis(ethylmethylamino)tungsten, bis(2,2,6,6-tetramethyl-3,5-heptanedionato)strontium, bis(2,2,6,6-tetramethyl-3,5-heptanedionato)barium, $M(R_nC_5H_{5-n})_2$, wherein n=1-5, R is selected from linear or branched C1-6 alkyls; $M(R_nC_4NH_{4-n})_2$, wherein n=2-4, R is selected from linear or branched C1-6 alkyls, and $M(R_nN_2H_{3-n})_2$, where n=2-3, R is selected from linear or branched C1-6 alkyls, tantalum pentaethoxide (TAETO), copper perfluoroacetylacetonate-trimethylvinylsilane and associated metallorganic copper, titanium, or tantalum compounds. Other materials, such as cobalt, barium, strontium, titanate mixtures such as barium strontium titanate and lead zirconate titanate precursors, as well as low-k dielectric precursors are also specified and are compatible with the system and method described herein.

This present invention is useful for liquid precursors which may either contain solid particulates or form solid particulates over time through a chemical change (decomposition) in the amount of >0.01 wt % and <20 wt %, preferably >0.1 wt % and <10 wt %. At the outlet of the container, such solids or dissolved solids may accumulate in the outlet valves or other locations downstream of the container. Deposition of these solid materials can cause plugging, flow restrictions, and other undesirable phenomena. Thus, those solid materials are undesirable for the deposition. Unlike the bubbler design, the solid particulates will not be delivered to the processing tool by using the systems designed in the present invention.

The present invention is in particular useful for example, for metal carbonyl precursors which may either contain solid particulates or form solid particulates over time through a chemical change.

Metal carbonyl precursor is a precursor comprising at least one carbonyl ligand attached to the metal center. Thermal stability of metal carbonyl precursors is often limited by partial pressure of carbon monoxide in the system. Thus, precursor delivery under elevated temperature and reduced pressure may result in the formation of precursor decomposition by-products which accumulate in the liquid precursor during delivery conditions. Examples of these precursors are not limited but include dicobalt hexacarbonyl tert-butylacetylene (CCTBA), dicobalt hexacarbonyl dialkylacetylene, cyclopentadienylcobalt dicarbonyl, alkylcyclopentadienyl cobalt dicarbonyl, cyclopentadienylmanganese tricarbonyl (CpMn(CO)$_3$), alkylcyclopentadienylmanganese tricarbonyl (e.g. MeCpMn(CO)$_3$, EtCpMn (CO)$_3$), cyclopentadienyltungsten tricarbonyl hydride (CpW (CO)$_3$H)), alkylcyclopentadienyl tricarbonyl hydride ((RCp)W(CO)$_3$H), tris(carbonyl)(alkylcyclopentadienyl)methyl tungsten ((RCp)W(CO)$_3$Me), tris(carbonyl)(alkylcyclopentadienyl)ethyl tungsten ((RCp)W(CO)$_3$Et), For those metal carbonyl precursor, the bursting of bubbles at the surface of the liquid in a bubbler-style container can lead to the formation of aerosols and/or mists. These aerosols or mists can become entrained in the carrier gas flow and transport solids or dissolved solids to the outlet of the container. Again, at the outlet of the container, such solids or dissolved solids may accumulate in the outlet valves or other locations downstream of the container. Deposition of these solid materials can cause plugging, flow restrictions, and other undesirable phenomena. Thus, those solid materials are undesirable for the deposition.

However, the system disclosed in the present invention overcomes the problem by not using a bubbler but an inlet jet design that can inject the carrier gas as a jet.

While the principles of the invention have been described above in connection with preferred embodiments, it is to be clearly understood that this description is made only by way of examples and not as a limitation of the scope of the invention.

WORKING EXAMPLES

Example 1

A 137.4 cubic inch (about 2.24 liters) container having a design depicted in FIG. 1 has been tested in the following manner.

Firstly, the container was configured with a bubbler-style inlet. More specifically, a 0.5 inch diameter tube submerged to within 0.25 inches from the bottom of the container was used as a bubbler, similar to designs suggested in U.S. Pat. No. 8,313,804 B2 and/or U.S. Pat. No. 6,033,479 A. A glass wool filter element was placed in the outlet tubing to collect any solid particles that might be entrained in the vapor flow exiting the container.

The container was filled with dicobalt hexacarbonyl tert-butylacetylene, a liquid precursor material with low vapor pressure that contained 12.5 wt % of combined solid and dissolved non-volatile impurities. A carrier gas consisting of nitrogen was delivered into the container at a flow rate of 600 sccm. The temperature and pressure conditions within the container were 50 Torr and room temperature (e.g., about 20-23° C.), respectively. The nitrogen carrier gas was bubbled through the precursor for 6 hours. At the end of the test, 52 mg of solid residue was collected on the glass wool filter.

The test was repeated using the system as shown in FIG. 1. The across section of the nozzle 7 was a circle with a diameter of one-quarter inch. The Reynolds number at the jet tip was 200. After 6 hours, no solid residue was collected on the glass wool filter placed in the outlet tubing.

This test has demonstrated how solid and non-volatile impurities can be transported out of a bubbler-style container, potentially clogging valves or introducing other performance issues. The test has also proved that the jet inlet design in the present invention prevents such solid impurities from being transported out of a container.

Example 2

The ability of the jet inlet design to achieve high degree of saturation was evaluated.

For all tests, the liquid chemical being delivered was a solution comprised of 90 weight percent (wt. %) ethylene glycol and 10 wt. % water with a vapor pressure of approximately 5 Torr to simulate a liquid chemical precursor. A carrier gas consisting of nitrogen was delivered into the container at a flow rate of 600 sccm. The temperature and pressure conditions within the container were 50 Torr and room temperature (e.g., about 20-23° C.), respectively.

For each measurement for the jet inlet design, the inlet configuration of the nozzle was varied to demonstrate the effect of the nozzle cross section width and distance of the nozzle tip to the surface of the liquid chemical (see "b" in FIG. 1). The results are provided in Table 1.

A comparative prior art configuration or bubbler configuration wherein the carrier gas was injected below the surface of the liquid chemical was also tested.

In this configuration, a 0.5 inch diameter circular tube submerged to within 0.25 inches from the bottom of the container was used as a bubbler, similar to designs suggested in U.S. Pat. No. 8,313,804 B2 and/or U.S. Pat. No. 6,033,479 A.

For all tests, the condensable precursor vapor contained in the gas stream exiting the container was collected by freezing out in a cold trap downstream of the container. The trap contents were then weighed after several hours of operation to determine the actual delivery rate of precursor. The delivery rate measured in this way was compared to the saturated delivery rate, which was calculated from the known vapor pressure, temperature, pressure, and carrier gas flow rate used in the experiments.

The saturated delivery rate is the amount of precursor that should be collected in the trap if the carrier gas exiting the container contains precursor vapor at a partial pressure equal to the precursor vapor pressure at the conditions in the container. The saturated delivery rate is the highest vapor-phase delivery rate that is physically possible under a given set of temperature, pressure, and carrier gas flow rate conditions.

For these examples, the vapor pressure of the model precursor was approximately 5.0 Torr at 23° C., so the maximum delivery rate was approximately 3.0 g/hr.

The measured delivery rate of precursor in Table 1 has been shown as a percentage of the maximum possible rate (3.0 g/hr), or percent of saturation. The estimated error in the measurements was approximately less or equal 10% due to small variations in precursor compositions and container temperature.

The percentage of saturation of each test was provided in Table 1.

TABLE 1

| Example | Inlet Nozzle Configuration | Reynolds Number | Nozzle Tip-to-liquid Distance (inches) | % of Saturation (error is ±10%) |
|---|---|---|---|---|
| 1A | ¼" Diameter jet, 1" from lid | 200 | 2.0" | 97 |
| 1B | ¼" Diameter jet, 1" from lid | 200 | 4.25" | 82 |

TABLE 1-continued

| Example | Inlet Nozzle Configuration | Reynolds Number | Nozzle Tip-to-liquid Distance (inches) | % of Saturation (error is ±10%) |
|---|---|---|---|---|
| 1C | 3/16" Diameter jet, 2" from lid | 300 | 0.75 | 96 |
| 1D | 3/16" Diameter jet, 2" from lid | 300 | 3.25 | 95 |
| 1E | Comparative - Submerged Bubbler | | n/a | 107 |

A ¼" diameter jet (larger diameter) jet inlet nozzle was used in Examples 1A and 1B. The Reynolds Number was 200 for the Examples. The container performed well with 97% percent of saturation when the liquid level was close to the jet nozzle (1A). However, as the liquid level dropped (1B) the performance declined, the percent of saturation went down from 97% in Example 1A to 82% in Example 1B. In applications, some decrease in delivery rate can be tolerated, while a large decrease in the delivery rate is undesirable.

Examples 1C and 1D repeated the experiment with a 3/16" diameter (smaller diameter) jet inlet nozzle. The Reynolds Number was 200 for the Examples. In these examples, the results has shown that there was no decrease in performance as the liquid level dropped and the container offered near-saturation levels of delivery (95% and 96% of saturation).

The results indicated that when other parameters were kept unchanged, a smaller jet nozzle increases the velocity of the jet, increases the Reynolds number of the jet flow, and allows the gas jet to remain intact over a longer distance. Higher Reynolds number flows allow the carrier gas to impinge on the liquid surface across a larger range of distances than lower Reynolds number flows.

For comparison, a gas inlet located below the liquid surface, known as a bubbler design, was also tested. The delivery rate measured was slightly above saturation, which indicated that some entrained liquid might have been removed from the container, as observed in Example 1.

These examples demonstrated that the inlet jet design in the present invention is capable of achieving mass transfer rates sufficient to saturate the carrier gas. Narrower jet nozzle diameters offer higher gas velocity (higher Reynolds numbers) and more consistent delivery rates as the liquid level declines. Higher Reynolds numbers allow the jet to remain intact over longer distances and will maintain performance across larger nozzle tip-to-liquid surface distances. A 3/16 inch diameter inlet jet is preferred under the tested carrier gas flow conditions and container size.

Example 3

Using the same containers and same materials under the same process conditions as in Example 1, an ultraviolet-visible spectroscopy cell was placed downstream of the filter element to measure the relative concentration of the precursor in the vapor stream. The relative concentration of the dicobalt hexacarbonyl tert-butylacetylene precursor was determined by comparing the absorbance spectra of the vapor stream when using the bubbler design to that when using the jet inlet design. The magnitude of the absorbance is proportional to the concentration of the precursor under these conditions. The nitrogen carrier gas does not absorb the measured wavelengths of light, so only the precursor is detected.

Nitrogen carrier gas was flowed through the container at 760, 260 and 100 Torr absolute pressure inside the container.

TABLE 2

| Pressure (Torr) | Relative Absorbance (Arbitrary Units) | |
|---|---|---|
| | Bubbler | Jet Inlet |
| 760 | 0.062 | 0.064 |
| 250 | 0.07 | 0.085 |
| 100 | 0.088 | 0.086 |

The relative absorbance measured for each pressure was shown in Table 2.

As shown in Table 2, the absorbances were equal, indicating that both designs achieve a saturated carrier gas at the outlet.

The delivery system with jet inlet design in the present invention can offer the same delivery performance as using the bubbler design system. Furthermore, the jet inlet design is especially useful for delivering the liquid precursors which may either contain solid particulates or form solid particulates over time through a chemical change (decomposition) under conditions found in the container. The bubbler design has been found not suitable for delivering the liquid precursors at all.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A container for storage and delivery of a chemical precursor to a process tool, comprising:
   a base and a lid, a sidewall that extends from the base and the lid and defines an interior volume;
   an outlet tube that extends through the lid;
   an inlet tube that extends through the lid and extends into the interior volume, the inlet tube having at least one nozzle, each of the at least one nozzle being located at a first end of the inlet tube that is distal to, and at a fixed distance from, the lid and operationally configured to direct a gas jet comprising a Reynolds number greater than 150 exiting the at least one nozzle toward the base;
   wherein when the chemical precursor is contained within the interior volume, the chemical precursor has an upper surface and the interior volume defines a headspace that extends from the upper surface to the lid;
   wherein the interior volume is free of any obstructions between each at least one nozzle and the upper surface and between each at least one nozzle and the outlet tube.

2. The container of claim 1, wherein each of the at least one nozzle is operationally configured to deliver a jet of a carrier gas.

3. The container of claim 1, wherein each of the at least one nozzle is operationally configured to direct a jet of carrier gas exiting the at least one nozzle in a direction that is perpendicular to the lid.

4. The container of claim 1, wherein each of the at least one nozzle comprises an opening; the opening comprising a cross section parallel to the lid; the cross section comprising an equivalent diameter of 0.0625 inch to 0.5 inch.

5. The container of claim 4, wherein the cross section comprises an equivalent diameter of 0.0625 inch to 0.25 inch.

6. The container of claim 4 wherein the opening of the nozzle comprises a perimeter; the perimeter defining a plane that is parallel to the lid.

7. The container of claim 1, wherein the inlet tube is parallel to the sidewall of the container.

8. The container of claim 4, wherein the opening of the nozzle comprises a first distance from the opening of the nozzle to the lid; wherein the first distance ranges from one to two inches and the effective diameter of the opening ranges from 0.1875 to 0.25 inch.

9. The container of claim 1, wherein the nozzle comprises a first distance from the container lid; wherein the sidewall extends a second distance from the lid to the base; and wherein the first distance is less than 50 percent of the second distance.

10. A container for storage a chemical precursor and delivery of a chemical precursor to a process tool using a carrier gas, the container comprising:
a base and a lid, a sidewall that extends from the base and the lid and defines an interior volume;
a head space that comprises all the interior volume located between an upper surface the chemical precursor and the lid container;
an outlet tube that extends through the lid;
an inlet tube that extends through the lid and into the interior volume, the inlet tube having an inlet tube sidewall that extends from the lid to an interior end that is distal to the lid,
at least one nozzle located at the interior end of the inlet tube;
wherein the inlet tube is operationally configured to direct all carrier gas flowing through the inlet tube through the at least one nozzle to produce a gas jet comprising a Reynolds number greater than 150, and to maintain a constant distance between the lid and the nozzle as the precursor declines during operation, and
wherein the head space is free of any obstructions between each at least one nozzle and the chemical precursor surface and between each at least one nozzle and the outlet tube.

11. The container of claim 10, wherein the interior volume comprises from 100 milliliters to 10 liters.

12. The container of claim 10, wherein the inlet tube sidewall is impermeable to the carrier gas.

13. The container of claim 10, wherein the inlet tube sidewall forms a 90 degree angle with the lid.

14. The container of claim 10, wherein the interior end of the inlet tube is a first distance from the lid, wherein the first distance ranges from one to two inches.

15. A container for storage and delivery of a chemical precursor to a process tool, comprising:
a base and a lid, a sidewall that extends from the base and the lid and defines an interior volume;
a chemical precursor comprising a liquid or solid material that is located in a lower portion of the interior volume, the chemical precursor defining a chemical precursor surface;
a head space extending from the chemical precursor surface to the lid;
an inlet tube that extends through the lid and extends into the interior volume, the inlet tube having at least one nozzle, each of the at least one nozzle being located at a first end of the inlet tube that is distal to, and at a fixed distance from, the lid, within the headspace, and operationally configured to direct a gas jet comprising a Reynolds number greater than 150 exiting the at least one nozzle toward the chemical precursor surface and to maintain a constant distance between the lid and the nozzle as the precursor declines during operation;
wherein the head space is free of any obstructions between each at least one nozzle and the chemical precursor surface and between each at least one nozzle and the outlet tube.

16. The container of claim 15, wherein the inlet tube is linear and substantially perpendicular to the chemical precursor surface.

17. The container of claim 15, wherein the first end of the inlet tube is located a first distance from the chemical precursor surface, wherein the first distance ranges from 0.75 inches to 3.25 inches.

18. The container of claim 17, wherein the nozzle comprises a diameter; the diameter ranging from 0.25 to 0.1875 inches.

19. The container of claim 18, wherein the diameter is 0.1875 inches.

20. The container of claim 1, wherein the at least one nozzle comprises a first distance from the container lid and wherein when the chemical precursor is present a second distance to the upper surface of the chemical precursor, wherein the second distance is at least 0.5 inches, and wherein when the second distance increases, the first distance remains fixed.

* * * * *